(12) United States Patent
Rossi et al.

(10) Patent No.: US 7,146,292 B2
(45) Date of Patent: Dec. 5, 2006

(54) METHOD AND A SYSTEM FOR EVALUATING AGING OF COMPONENTS, AND COMPUTER PROGRAM PRODUCT THEREFOR

(75) Inventors: Giammarco Rossi, Stradella (IT); Luigi Gastaldi, Fiano (IT); Paolo Montangero, Turin (IT); Ezio Riva, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 84 days.

(21) Appl. No.: 10/918,688

(22) Filed: Aug. 13, 2004

(65) Prior Publication Data
US 2005/0049833 A1 Mar. 3, 2005

(30) Foreign Application Priority Data
Aug. 27, 2003 (GB) .................................. 0319993.2

(51) Int. Cl.
*G21C 17/00* (2006.01)
*G01B 3/44* (2006.01)
(52) U.S. Cl. .................. 702/183; 702/34; 702/177; 369/53.26
(58) Field of Classification Search .................. 702/34, 702/177, 183; 369/53.26
See application file for complete search history.

(56) References Cited

U.S. PATENT DOCUMENTS

| | | | |
|---|---|---|---|
| 4,890,588 A * | 1/1990 | Tillman | 123/78 E |
| 5,019,769 A | 5/1991 | Levinson | 372/31 |
| 5,625,616 A | 4/1997 | Koike et al. | 369/116 |
| 5,646,540 A | 7/1997 | Stals et al. | 324/691 |
| 5,867,809 A | 2/1999 | Soga et al. | 702/130 |
| 6,177,814 B1 * | 1/2001 | Taguchi | 327/58 |
| 6,249,712 B1 * | 6/2001 | Boiquaye | 700/31 |
| 2004/0130484 A1 * | 7/2004 | Krasner | 342/357.02 |

FOREIGN PATENT DOCUMENTS

| | | |
|---|---|---|
| GB | 1 518 695 | 7/1978 |
| WO | WO 92/05608 | 4/1992 |

* cited by examiner

*Primary Examiner*—Marc S. Hoff
*Assistant Examiner*—Janet L Suglo

(57) ABSTRACT

A method for evaluating the aging level of a component includes measuring values of the elapsed time in operation of the component ($t_{m,i}$), at least one entity ($I_{m,i}$) indicative of the aging of the component, and the temperature ($T_{m,i}$) of the component, and processing the values measured as a function of a reference temperature ($T_{ref}$) to produce corresponding normalized reference values ($t_{ref,i}$; $I_{m,i}$) representative of virtual operation of the component at said reference temperature ($T_{ref}$). An updated prediction model for the at least one entity over time is generated from the reference values ($t_{ref,i}$; $I_{m,i}$). A predicted value ($I_{fit}$) for the at least one entity at a given time obtained by means of the prediction model is compared with an aging threshold. An aging warning signal is generated if the comparison indicates deviation of the predicted value ($I_{fit}$) beyond an acceptable range.

28 Claims, 3 Drawing Sheets

METHOD AND A SYSTEM FOR EVALUATING AGING OF COMPONENTS, AND COMPUTER PROGRAM PRODUCT THEREFOR

BACKGROUND OF THE INVENTION

1. Field of the Invention

The present invention relates to techniques for evaluating/monitoring aging of components such as components in communication networks.

2. Brief Description of Related Developments

In modern communication networks, constantly monitoring performance of network elements is essential in order to guarantee reliable and stable links. Specifically, being able to prevent failure events that may lead to service disruption is a definite asset. In this scenario, technological solutions are being investigated in order to monitor the aging of key components and alert the network operator of possible forthcoming failures.

Predicting electronic component reliability is a known science, which allows e.g. the time to failure (TTF) of a specific key device to be predicted with a good degree of confidence. This usually permits components to be selected in such a way that their predicted TTF falls beyond the prospected useful life of the component.

Recent solutions exploit on-board monitoring of key devices in order to keep track of some fundamental parameters that may affect device performance (such as e.g. the supply current).

For instance, U.S. Pat. No. 5,019,769 discloses an arrangement where the drive current of a laser diode is monitored by storing measurement data in a non-volatile memory of a controller. The controller is thus enabled to predict failure of the laser diode and send a warning to a host computer, prior to failure of the device, that the laser diode needs to be replaced. Specifically, when the controller finds that the drive current required for generating a predefined level of optical output power exceeds by a predetermined threshold percentage the original level of drive current needed when the device was new, after compensating for any temperature differences between the measurements being compared, failure of the device is imminent and the controller will generate a warning message.

A basic disadvantage of this arrangement lies in that it is intrinsically static. In fact, such an arrangement is unable to detect a situation where, while still exhibiting an acceptable value, the entity being monitored (e.g. the drive current) is rapidly approaching the threshold value, which is likely to indicate an early failure.

Additionally, similar arrangements can in most instances be implemented only if the transceiver stops transmitting data and is switched to a self-diagnosis state, in which case the transceiver is not available for operation. This downtime is hardly acceptable for many applications.

SUMMARY OF THE INVENTION

The object of the present invention is to provide an improved arrangement dispensing with the intrinsic drawbacks of the prior art arrangements, especially as regards the possibility of implementing "dynamic" monitoring schemes of component aging and/or avoiding interruption of operation of the component during the evaluation process.

According to the present invention, that object is achieved by means of a method having the features set forth in the annexed claims. The invention also relates to a corresponding system and a computer program product loadable in the memory of a computer and including software code portions for performing the method of the invention when the product is run on a computer.

An embodiment of the invention involves using a temperature monitor, a drive current monitor and a processing unit (such as e.g. a microprocessor) to correlate these measurements with the time elapsed in operation of the device in order to establish if an opto-electronic component such as e.g. a laser is degrading. This may be achieved by recording the temperature and the drive current and monitoring the evolution of these parameters.

Specific reliability studies provide degradation models adapted to be used for predicting the time to failure (TTF) with a proper confidence level. These models can be implemented in a processing unit through proper programming. Once the processing unit has recorded the early evolution of the operating parameters of the component/device, it can calculate at any time an expected aging level of the device. If e.g. the actual monitored situation is found to be worse than expected on the basis of the model prediction, a failure risk factor is identified and evaluated by the processing unit that can eventually activate an alarm.

The advantage of this approach is that monitoring can be performed dynamically, during normal operation, without de-activating the component for self-diagnosis, while more reliably indicating when the component may require to be replaced in order to avoid actual failure.

The invention can be implemented by means of an on-board or off-board processing unit or any other analog or digital circuit capable of correlating entities such as e.g. temperature, drive current and elapsed time. Such a processing unit is intended to co-operate with sensor devices such as a temperature sensor (adapted to detect the component temperature), and a drive current monitor. The sensor devices are adapted to detect the values of the corresponding parameters during the early days of operation of the component. The processing unit is able to calculate the time elapsed in operation and programmed in order to correlate time, temperature, drive current and to calculate the rate of aging.

BRIEF DESCRIPTION OF THE DRAWINGS

The invention will now be described, by way of example only, with reference to the annexed drawings, wherein.

DETAILED DESCRIPTION OF THE PREFERRED EMBODIMENTS

Figure 1:
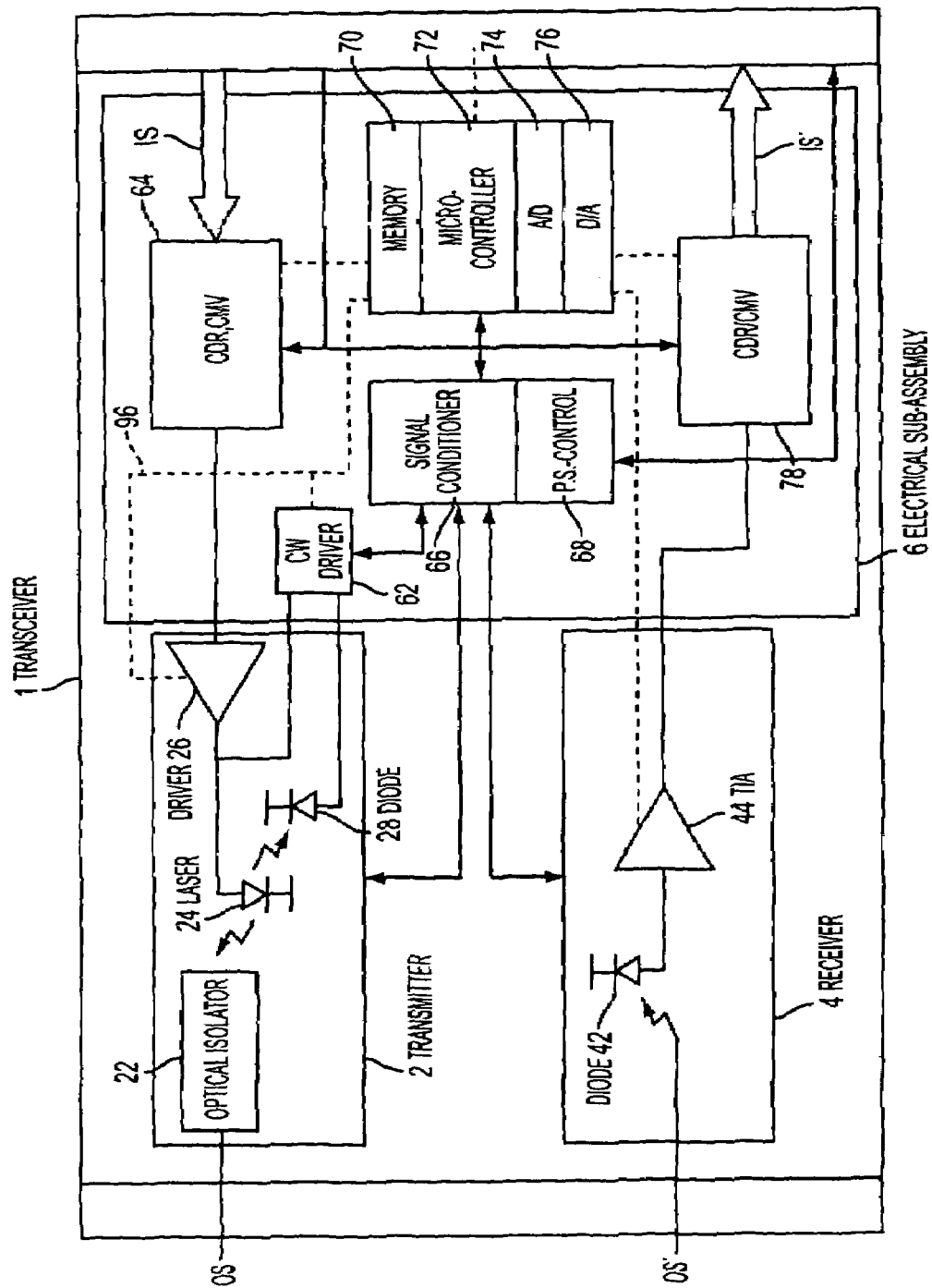
FIG. 1 is a block diagram of a system for monitoring in real time the aging of a laser in an electro-optical transceiver.

In FIG. 1 an electro-optical transceiver 1 is shown essentially comprised of three basic building blocks, namely:

a transmitter optical sub-assembly (TOSA) 2, a receiver optical sub-assembly (ROSA) 4, and an electrical sub-assembly (ESA) 6.

The sub-assembly 2 includes a laser 24 that, in the exemplary embodiment described herein, represents the electro-optical component whose aging is to be evaluated as better explained in the following.

Operation of the transmitter portion 2 of the transceiver 1 provides for a digital input signal IS (such as e.g. a digital 10 Gbit/s bit stream) from an electrical connector being fed to a clock data recovery (CDR) or clock monitoring (CMV) unit 64 of the kind currently referred to as an "eye-opener".

The eye-opener 64 converts the digital input signal IS into an analog signal, which is passed on to a RF-driver 26 and the laser 24.

The optical radiation OS generated by the laser 24 driven by the driver 26 is finally passed through an optical isolator 22 to be then injected into an optical fiber (not shown).

Operation of the receiver portion 4 of the transceiver 1 provides for a received optical signal OS' from a fiber (not shown) being fed to an opto-electrical converter (such as a PIN-diode 42) and a trans-impedance amplifier (TIA) 44. The analog output signal from the amplifier 44 is fed to a further eye-opener 78. The eye-opener 78 converts the analog signal into a digital output signal IS' (such as e.g. a digital 10 Gbit/s bit stream).

The general layout described in the foregoing is typical of an opto-electrical transceiver produced with well-known technology, thus making it unnecessary to provide a more detailed description herein.

The sub-assembly 2 contains an optical monitor device (such as e.g. a monitor PIN-diode 28) arranged to sample the optical power from the laser 24. For instance, the diode 28 collects the optical power emitted from the back facet of the laser 24. The signal from the diode 28 is fed to a continuous wave (CW) driver 62 that implements a closed loop in order to keep the "useful" power emitted from the front facet of the laser 24 essentially constant. The CW driver 62 is wired through a digital bus 96 to a micro-controller 72.

Associated with the micro-controller 72 are a memory (such as an EEPROM) 70, an analog-to-digital converter (A/D) 74 and, typically, a digital-to-analog (D/A) converter 76.

Finally, reference number 66 designates an analog signal conditioner with an associated power supply control 68.

The conditioner 66 is adapted to co-operate with the micro-controller 72 in order to permit the micro-controller 72 to "sense" the temperature, the power and the drive current of the laser 24.

The micro-controller 72 can be programmed (e.g. by means of a program stored in the EEPROM 70) in order to read and store the values sensed and correlate them with a proper process (an example is given in FIG. 2) in order to monitor the aging level of the laser 24.

To that purpose, the arrangement described herein provides for the parameter(s) being monitored such as e.g. the drive current of the laser 24 being measured over the operating life of the component whose aging is to be evaluated in a dynamic way.

This is done by taking into account that certain operating conditions (e.g. operation at a high temperature) may in fact "weigh" more—thus leading to accelerated aging of the component—than operation at e.g. room temperature.

Specifically, at specific points in time during the operating life of the component (each such point being generally designated "i") the following parameters are measured:

the time in operation ($t_{m,i}$), such as e.g. the cumulative elapsed time from the first power-on of the laser 24,
the laser temperature ($T_{m,i}$), and
the laser drive current ($I_{m,i}$).

These measurements are performed periodically over the useful life of the component, at time intervals (e.g. days, weeks or months, depending on the type of component considered) selected such as to correspond to meaningful possible changes in the entities measured.

The measurements are typically effected via the conditioner 66 and the converter 74. The respective data thus generated are processed in the processor 72 in order to compute, starting from the actual measured values, reference values that can be regarded as exemplary of virtual operation of the laser 24 at a reference temperature $T_{ref}$.

For instance, in the exemplary case of the laser diode 24 considered herein, at each time i, an equivalent time $t_{ref,i}$ is calculated e.g. by means of the relationship:

$$-t_{ref,i} = \sum_i (t_{m,i} - t_{m,i-1}) \exp\left[\frac{E_a}{K}\left(\frac{1}{T_{ref}} - \frac{1}{T_{m,i}}\right)\right]$$

(Arrhenius' law)

where $E_a$ is the activation energy [eV—adapted to be measured experimentally for each component type], K is the Boltzmann constant [eV/K], which is equivalent to $8.6 \times 10^{-5}$ eV/K, $T_{ref}$ is the reference temperature (e.g. 85° C.) and $T_{m,i}$ is the actual measured temperature of the laser 24; temperatures are in Kelvin degrees.

Obviously, $t_m - t_{m,i-1}$ represents the (actual) time span elapsed between the latest measurement at time i−1 and the current measurement at time i.

The processing step just described amounts to a sort of "time warping" process intended to take into account the effect of temperature on the aging level of the component by calculating a reference aging time $t_{ref,i}$.

Essentially, the value for the reference aging time $t_{ref,i}$ thus calculated corresponds to a virtual operation time of the component at the reference temperature $T_{ref}$, i.e. a time corresponding to the aging time that the component 24 "would have" if operated always at the reference temperature $T_{ref}$.

The relationship reported in the foregoing essentially implements a sort of weighing of the actual value of time measured as a function of the actual operating temperature measured $T_{m,i}$. This amounts in practice to letting those periods of time where the component operates at higher temperatures weigh more than the periods of operation at lower temperatures in producing any estimate/prediction of the residual life of the component.

Similarly, starting from the actual measured value for the drive current $I_{m,i}$, a corresponding reference value for the drive current $I_{ref,i}$ is determined at each time instant i. This processing step is essentially intended to take into account the fact that the actual temperature $T_{m,i}$ of the laser 24 at which the drive current $I_{m,i}$ is measured will generally differ from the reference temperature $T_{ref}$.

Stated otherwise, a reference value for the drive current $I_{ref,i}$ is determined that corresponds as closely as possible to the value of the drive current in the presence of virtual operation of the laser 24 at the reference temperature $T_{ref}$, i.e. the value of the drive current that "would" be measured (at the time instant i) if the laser 24 were operating at the reference temperature $T_{ref}$.

A number of different approaches can be resorted to in order to obtain the reference value $I_{ref,i}$ from the value $I_{m,i}$ actually measured for the drive current.

A first approach is based on the relationship:

$$I_{ref,i} = I_{m,i} + C(T_{ref} - T_{m,i})$$

where C is a proper constant value, while $T_{ref}$ and $T_{m,i}$ are the reference temperature (e.g. 85° C.) and the actual measured temperature, respectively.

Experiments performed by the Applicants show that a higher degree of accuracy can be achieved by resorting to the relationship $$I_{ref,i} = I_{m,i} \exp((T_{ref} - T_{m,i})/T_a)$$

where $T_a$ is a scaling temperature value adapted to be determined experimentally for each component type.

Other analytical relationships adapted to be used for the same purpose can be found at page 59 of L. A. Coldren, S. W. Corzine: "Diode lasers and photonic integrated circuits", John Wiley & Sons, 1995.

As a further alternative, the value for the reference drive current $I_{ref,i}$ can be retrieved in a look-up table (LUT) stored e.g. in the memory 70 associated with the processor 72. Such a look-up table can be generated experimentally for a given component type by recording values for the reference drive current $I_{ref,i}$ corresponding to given entry values for the measured drive current $I_{m,i}$ at different values of the actual temperature of the component $T_{m,i}$.

It will be appreciated that same approach, based on the use of a look-up table can be resorted to in order to determined the reference aging time $t_{ref,i}$ starting from the actual time in operation $t_{m,i}$ as measured.

Data analysis and forecast based on the reference values $t_{ref,i}$ and $I_{ref,i}$ thus obtained are exploited in evaluating the present aging level of the laser 24 and the possible future evolution thereof. This is done by resorting to any known prediction model adapted for that purpose.

In order to do so, it will be generally assumed that during early operation of the component such as the laser 24, a certain amount of different values for $t_{ref,i}$ and $I_{ref,i}$ are collected in order to constitute a sufficiently reliable basis for a prediction process.

After, say, k measurements have been performed on the component 24, two sets of k values each will thus be available for $t_{ref,i}$ and $I_{ref,i}$, respectively.

Figure 3:
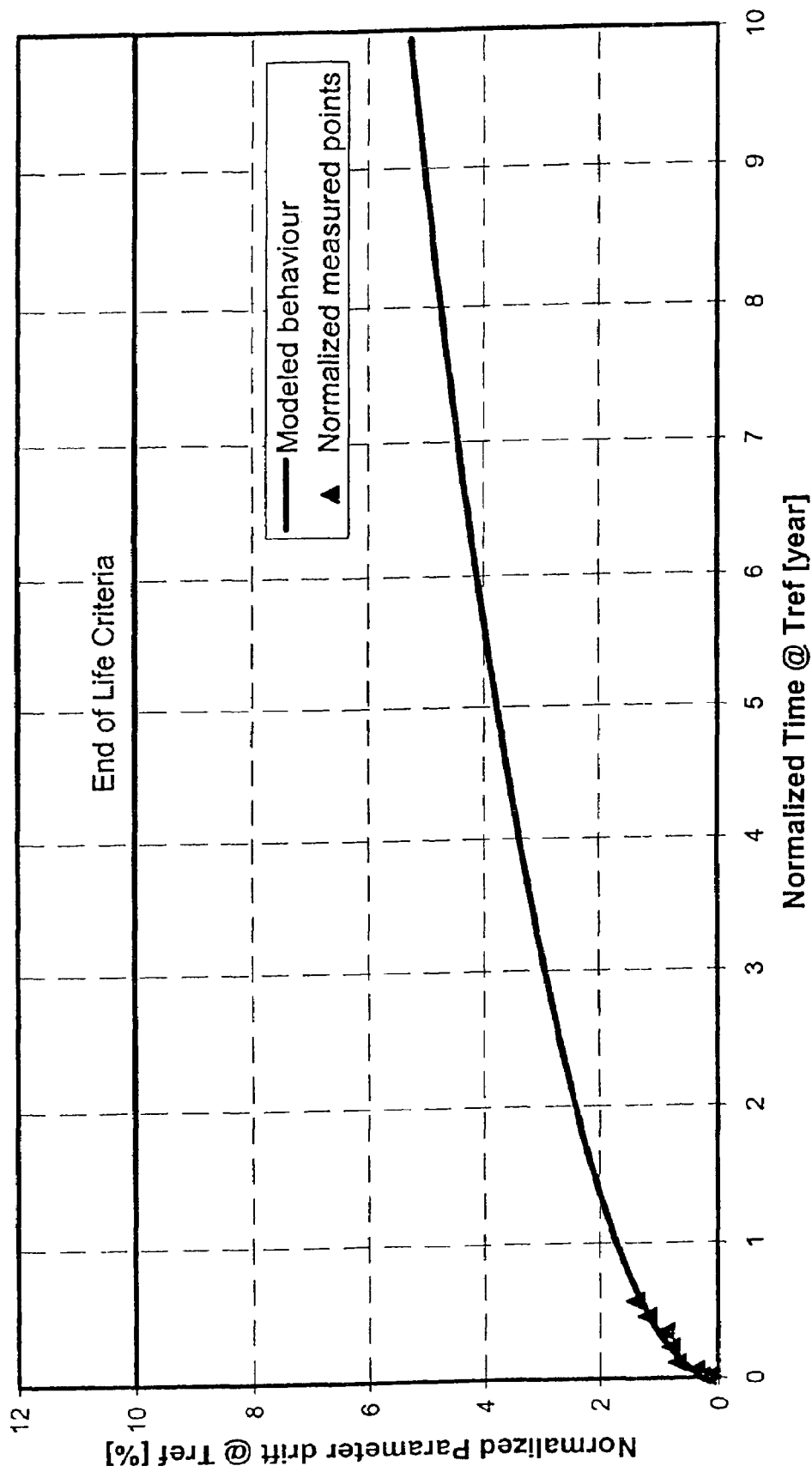
FIG. 3 is an exemplary diagram of data which may be collected and processed within the framework of the method described herein.

The points marked as ▲ in the bottom left corner of the exemplary graph of FIG. 3 correspond to two such sets of values for:

the reference time $t_{ref,i}$, namely the normalized time at the reference temperature $T_{ref}$ reported on the abscissa or x-scale, and the reference drive current $I_{ref,i}$, namely the normalized drive current at the reference temperature $T_{ref}$ reported as the reference parameter whose drift over time is indicative of the component aging reported—possibly as a percentage drift—on the ordinate or y-scale.

The mutual relationship thus determined will be adapted to produce at any time i an updated prediction model (that is a modelled behaviour) for the drive current for the laser 24 as a function of time. Such a modelled behaviour is shown as a continuous line in the exemplary graph of FIG. 3.

It will be appreciated that such a modelled behaviour is based on values for the drive current and time that are "normalized" values at the reference temperature $T_{ref}$ that is values for which the effects due the operating temperature of the laser 24 being generally variable over time and different from the reference temperature $T_{ref}$ have been dispensed with.

Stated otherwise, the prediction model thus obtained will be an absolute one, independent of the operating temperatures of the laser 24 being generally variable and different from the reference temperature $T_{ref}$.

The prediction model in question can be represented by a parameter drift function—e.g. of the kind $\Delta par_i(t) = A_i(t)^{n_i}$, where $\Delta par_i(t)$ is the parameter drift function modelled at time $t_i$, $A_i$ and $n_i$ are model constants estimated at time $t_i$-best fitting the set of points marked as ▲ in FIG. 3.

Such a fitting function may be determined by using any known method such as MMSE fitting. Alternatively, the prediction model in question may be represented by a numerical extrapolation of the relationship portrayed in FIG. 3.

Once the parameters for the (updated) prediction model, namely $A_i$ and $n_i$ are estimated, the corresponding prediction model thus obtained makes it possible to forecast a value $I_{fit,i}(t) = I(0) + \Delta I_{fit,i}(t)$ (where $I(0)$ is the initial driving current value) for the drive current at any desired point in time.

A comparison of the values forecast with expected acceptable values follows. Actions are then taken (such as e.g. alerting the network operator or activating a back-up component to substitute the irregularly aging component) based on the outcome of the comparison.

Such a comparison typically involves the predicted value and a reference threshold.

For instance, the value of the drive current $I_{fit}$ predicted for a given future time on the basis of the prediction model (as represented e.g. by the function $\Delta I_{fit,i}(t) = A_i(t)^{n_i}$) can be compared to one or more threshold values that define the limit(s) of a range compatible with acceptable operation of the laser 24 at that future time.

The graph of FIG. 3 portrays an exemplary modelled (i.e. predicted) behaviour for the drive current over ten years of operation of the device against an upper value (e.g. 10% upward drift) representing an end-of-life criteria. A direct comparison may thus be effected any time during the time span shown.

Alternatively, the comparison may be against a time threshold and involve the following steps:

determining the future instant of time where the value of the drive current $I_{fit}$ as predicted based on the prediction model will equal a value considered to be a limit value of a range compatible with acceptable operation of the laser, and comparing the instant of time thus determined with a time threshold corresponding e.g. to an acceptable useful life for the component.

As a further alternative, the comparison may involve a comparison between:

the value for the drive current $I_{fit}$ as predicted at the instant of time where the k-th measurement is taken the prediction being based on the k−1 previous measurements, and the actual/normalized value of the drive current at the instant of time considered.

For instance, by referring to the first example made in the foregoing, if—contrary to the behaviour shown in the graph of FIG. 3—the predicted drive current in a long-time perspective (e.g. after 5 or 10 years of operation) were to fall outside the acceptable range of values after the same period of operation—i.e. by showing a drift higher that the +10% end-of-life threshold value shown in FIG. 3, a warning message may be issued from the processor 72.

Analogously, by referring to the two other examples made previously, a similar message may be generated if:

the value of the drive current $I_{fit}$ is predicted to be bound to reach a limit value of a range compatible with operation of the laser within a time period appreciably shorter than the acceptable useful life for the component, or the normalized value obtained from the k-th measurement differs appreciably from the value predicted on the basis of the k−1 previous measurements.

It will be appreciated that in all of the exemplary cases considered, monitoring is dynamic, in that any possible "swerving" of the behaviour of the component monitored from the expected behaviour can be predicted reliably long before a situation may arise likely to lead to actual malfunctioning or operation being discontinued.

Of course, the possibility will also exist of delaying the issue of an alarm signal in such a way that such an alarm is generated only after repeated comparisons at subsequent instants of time have indicated a component behaviour likely to be deviating from the expected one.

Figure 2:
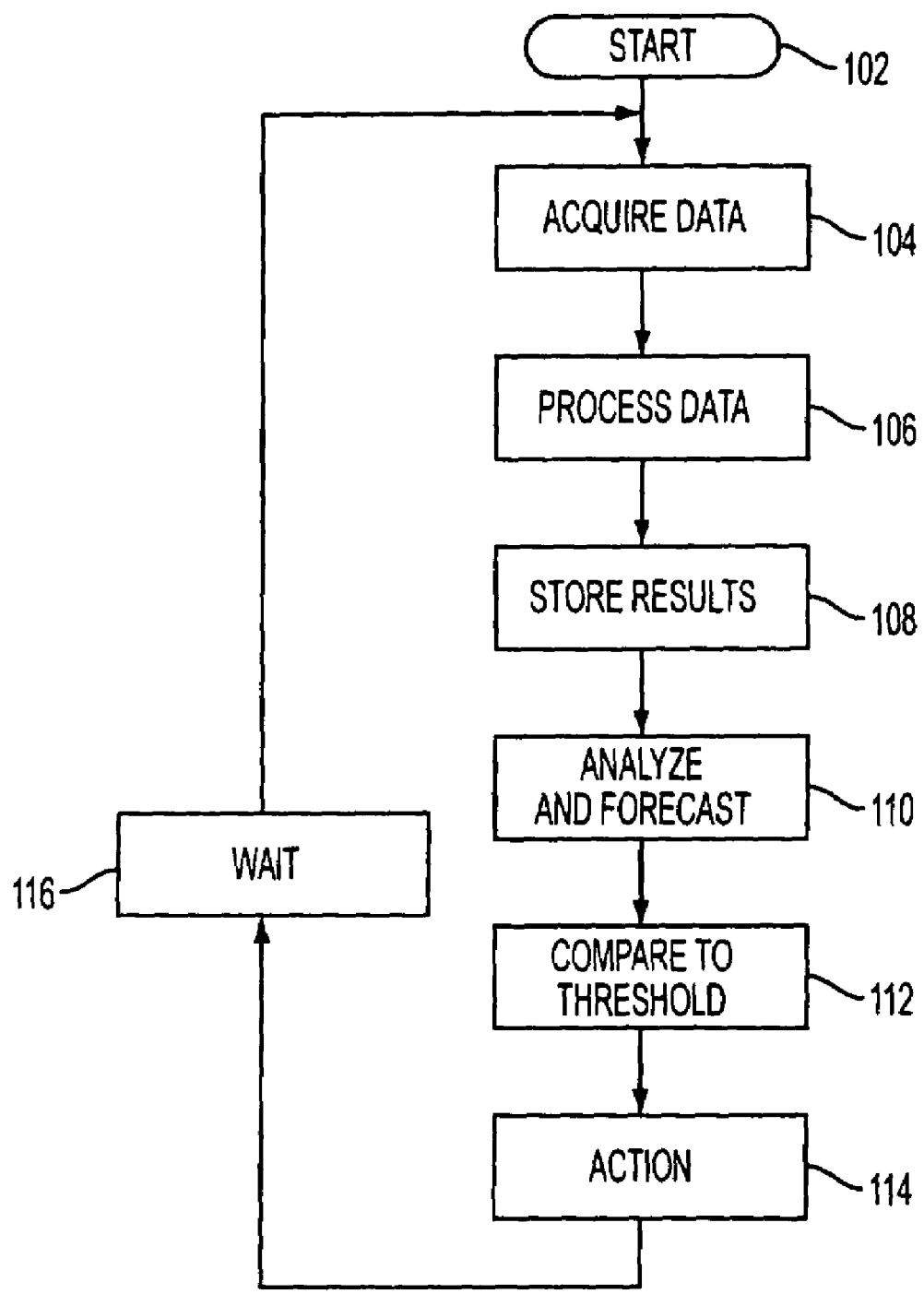
FIG. 2 is an exemplary flowchart of an embodiment of the method described herein.

An exemplary way of performing the process just described at any instant i=0, . . . ,n over the useful life of a component, is shown in the flowchart of FIG. 2.

Starting from a start step 102, in a step 104 data acquisition is performed. In such a step the following parameters are acquired by the micro-controller 72:

the elapsed time in operation ($t_{m,i}$),
the temperature ($T_{m,i}$), and
the drive current ($I_{m,i}$) of laser 24.

Subsequently, in a step 106 these data are processed as explained in the foregoing to produce the corresponding reference values $t_{ref,i}$ and $T_{ref,i}$.

In a step 108, the data resulting from processing are stored in the memory 70, while in a step 110 data analysis and forecasting is performed in order to produce the updated prediction model and the predicted value $I_{fit}$.

In a step 112 the predicted value is compared with a threshold as described in the foregoing. Finally, in a step 114 actions are taken on the basis of the results of the comparison.

For instance, if the comparison indicates that the predicted aging level is acceptable, operation of the component 24 is maintained. The aging/reliability assessment process as described is then repeated after a certain time interval; this is represented by a "wait" step 116, after which the sequence of steps 104 to 114 is repeated.

Conversely, if the comparison indicates that the predicted aging level is not acceptable, an alarm signal is generated. This may e.g. be a visual signal adapted to be displayed by a light source or a display screen thus alerting the network operator that a risk situation exists that may require/suggest e.g. to replace the component 24.

It is thus evident that, the basic principles of the invention remaining the same, details and embodiments may widely vary with respect to what has been described and illustrated purely by way of example, without departing from the scope of the presented invention as defined in the annexed claims. Also, terms such as "optical", "light", "photosensitive", and the like are evidently used herein with the meaning currently allotted to those terms in fiber and integrated optics, being thus intended to apply to radiation including, in addition to visible light, e.g. also infrared and ultraviolet radiation.

What is claimed is:

1. A method of evaluating aging of a component, characterized in that it includes the steps of:
    a) performing at repeated instants of time (i) during the useful life of the component, the steps of:
        measuring values of the elapsed time in operation of the component ($t_{m,i}$), at least one entity ($I_{m,i}$) indicative of the aging of the component, and the temperature ($T_{m,i}$) of the component,
        processing the values as measured as a function of a reference temperature ($T_{ref}$) to produce reference values ($t_{ref,i}$; $I_{m,i}$) for said elapsed time in operation of the component ($t_{m,i}$) and said at least one entity ($I_{m,i}$) indicative of the aging of the component, wherein said reference values ($t_{ref,i}$; $I_{m,i}$) are normalized values representative of virtual operation of said component at said reference temperature ($T_{ref}$);
    b) generating, starting from said reference values ($t_{ref,i}$; $I_{m,i}$) for said elapsed time in operation of the component ($t_{m,i}$) and said at least one entity ($I_{m,i}$) indicative of the aging of the component, an updated prediction model ($A_i(t)''_i$) for said at least one entity over time,
    c) predicting, by means of said updated prediction model ($A_i(t)''_i$), a predicted value ($I_{fit}$) of said at least one entity at a given time,
    d) performing a comparison involving said predicted value ($I_{fit}$) and at least one aging threshold, and
    e) issuing an aging warning signal if said comparison indicates deviation of said predicted value ($I_{fit}$) beyond an acceptable range.

2. The method of claim 1, characterized in that said component is a laser and said at least one entity is the drive current thereof.

3. The method of claim 1, characterized in that said step of processing includes the step of producing said reference values ($t_{ref,i}$) for the elapsed time in operation of the component ($t_{m,i}$) following the relationship:

$$-t_{ref,i} = \sum_i (t_{m,i} - t_{m,i-1}) \exp\left[\frac{E_a}{K}\left(\frac{1}{T_{ref}} - \frac{1}{T_{m,i}}\right)\right]$$

where $t_{ref,i}$ and $t_{m,i}$ are said reference value and the measured value for said elapsed time in operation of the component, $E_a$ is the activation energy thereof [eV], K is the Boltzmann constant [eV/K], $T_{ref}$ is said reference temperature, $T_{m,i}$ is the actual measured temperature of the component and the temperatures are in Kelvin degrees.

4. The method of claim 1, characterized in that said step of processing includes the step of producing said reference values ($t_{ref,i}$) for the elapsed time in operation of the component ($t_{m,i}$) by retrieving said reference values ($t_{ref,i}$) in a look-up table for entries represented by measured values ($t_{m,i}$) for said elapsed time in operation of the component and measured values ($T_{m,i}$) for said actual temperature of the component.

5. The method of claim 1, characterized in that said step of processing includes the step of producing said reference values ($I_{ref,i}$) for said at least one entity indicative of the aging of the component by means of an analytical relationship relating, as a function of temperature, said reference values ($I_{ref,i}$) for said at least one entity indicative of the aging of the component to said measured values ($I_{m,i}$) for said at least one entity indicative of the aging of the component.

6. The method of claim 5, characterized in that said analytical relationship is selected from the group consisting of the relationships:

$$I_{ref,i} = I_{m,i} + C(T_{ref} - T_{m,i})$$

$$I_{ref,i} = I_{m,i} \exp((T_{ref} - T_{m,i})/T_a)$$

where C is a constant value, $T_a$ is a scaling temperature value and $I_{ref,i}$ and $I_{m,i}$ are said reference value and said measured value, respectively, for said at least one entity indicative of the aging of the component.

7. The method of claim 1, characterized in that said step of processing includes the step of producing said reference values ($I_{ref,i}$) for said at least one entity indicative of the aging of the component by retrieving said reference values ($I_{ref,i}$) in a look-up table for entries represented by measured values ($I_{m,i}$) for said at least one entity indicative of the aging of the component and measured values ($T_{m,i}$) for said actual temperature of the component.

8. The method of claim 1, characterized in that said updated prediction model is generated as a drift function of the type $A_i(t)^{n_i}$.

9. The method of claim 1, characterized in that said updated prediction model is a numerical extrapolation model.

10. The method of claim 1, characterized in that said comparison includes comparing a value ($I_{fit}$) for said at least one entity indicative of the aging of the component predicted for a given future time on the basis of said updated prediction model with at least one threshold value defining a limit of a range of acceptable values for operation of said component at said given future time.

11. The method of claim 1, characterized in that said comparison includes the operations of:
    determining a future instant of time where, based on said updated prediction model, a predicted value ($I_{fit}$) for said at least one entity indicative of the aging of the component will equal a limit of a range of acceptable values for operation of said component, and
    comparing said future instant of time thus determined with a time threshold corresponding to an acceptable useful life for the component.

12. The method of claim 1, characterized in that said comparison includes the operation of comparing:
    a value ($I_{fit}$) for said at least one entity indicative of the aging of the component as predicted for a given instant of time on the basis of said updated prediction model, and
    a value for said at least one entity indicative of the aging of the component as derived from measurement at said given instant of time.

13. The method of claim 1, characterized in that the method is carried out without interrupting operation of said component.

14. A computer program product loadable in the memory of computer and including software code portions for performing the method of claim 1 when the product is run on a computer.

15. A system for evaluating aging of a component, characterized in that it includes:
    at least one detector unit for measuring, at repeated instants of time (i) during the useful life of the component, values of the elapsed time in operation of the component ($t_{m,i}$), at least one entity ($I_{m,i}$) indicative of the aging of the component, and the temperature ($T_{m,i}$) of the component,
    a processing unit for evaluating the aging level of said component, the processing unit being configured for:
    a) processing the values measured by said at least one detector unit as a function of a reference temperature ($T_{ref}$) to produce reference values ($t_{ref,i}$; $I_{m,i}$) for said elapsed time in operation of the component ($t_{m,i}$) and said at least one entity ($I_{m,i}$) indicative of the aging of the component, wherein said reference values ($t_{ref,i}$; $I_{m,i}$) are normalized values representative of virtual operation of said component at said reference temperature ($T_{ref}$);
    b) generating, starting from said reference values ($t_{ref,i}$; $I_{m,i}$) for said elapsed time in operation of the component ($t_{m,i}$) and said at least one entity ($I_{m,i}$) indicative of the aging of the component, an updated prediction model ($A_i(t)^{n_i}$) for said at least one entity over time,
    c) predicting, by means of said updated prediction model ($A_i(t)^{n_i}$), a predicted value ($I_{fit}$) of said at least one entity at a given time,
    d) performing a comparison involving said predicted value ($I_{fit}$) and at least one aging threshold, and
    e) issuing an aging warning signal if said comparison indicates deviation of said predicted value ($I_{fit}$) beyond an acceptable range.

16. The system of claim 15, characterized in that said component is a laser and said at least one entity is the drive current thereof.

17. The system of claim 15, characterized in that said processing unit is configured for producing said reference values ($t_{ref,i}$) for the elapsed time in operation of the component ($t_{m,i}$) following the relationship:

$$-t_{ref,i} = \sum_i (t_{m,i} - t_{m,i-1}) \exp\left[\frac{E_a}{K}\left(\frac{1}{T_{ref}} - \frac{1}{T_{m,i}}\right)\right]$$

where $t_{ref,i}$ and $t_{m,i}$ are said reference value and the measured value for said elapsed time in operation of the component, $E_a$ is the activation energy thereof [eV], K is the Boltzmann constant [eV/K], $T_{ref}$ is said reference temperature, $T_{m,i}$ is the actual measured temperature of the component and the temperatures are in Kelvin degrees.

18. The system of claim 15, characterized in that it includes a memory area for storing a look-up table and said processing unit is configured for accessing said memory area and producing said reference values ($t_{ref,i}$) the elapsed time in operation of the component ($t_{m,i}$) by retrieving said reference values ($t_{ref,i}$) in a look-up table for entries represented by measured values ($t_{m,i}$) for said elapsed time in operation of the component and measured values ($T_{m,i}$) for said actual temperature of the component, wherein said look-up table is stored in said memory area.

19. The system of claim 15, characterized in that said processing unit is configured for producing said reference values ($I_{ref,i}$) for said at least one entity indicative of the aging of the component by means of an analytical relationship relating, as a function of temperature, said reference values ($I_{ref,i}$) for said at least one entity indicative of the aging of the component to said measured values ($I_{m,i}$) for said said at least one entity indicative of the aging of the component.

20. The system of claim 19, characterized in that said analytical relationship is selected from the group consisting of the relationships:

$$I_{ref,i} = I_{m,i} + C(T_{ref} - T_{m,i})$$

$$I_{ref,i} = I_{m,i} \exp((T_{ref} - T_{m,i})/T_a)$$

where C is a constant value, $T_a$ is a scaling temperature value and $I_{ref,i}$ and $I_{m,i}$ are said reference value and said measured value, respectively, for said at least one entity indicative of the aging of the component.

21. The system of claim 15, characterized in that it includes a memory area for storing a look-up table and said processing unit is configured for accessing said memory area and producing said reference values ($I_{ref,i}$) for said at least one entity indicative of the aging of the component by retrieving said reference values ($I_{ref,i}$) in a look-up table for entries represented by measured values ($I_{m,i}$) for said at least one entity indicative of the aging of the component and measured values ($T_{m,i}$) for said actual temperature of the component, wherein said look-up table is stored in said memory area.

22. The system of claim 15, characterized in that said processing unit is configured for generating said updated prediction model as a function of the type $A_i(t)^{n_i}$.

23. The system of claim 15, characterized in that said processing unit is configured for generating said updated prediction model as a numerical extrapolation model.

24. The system of claim 15, characterized in that said processing unit is configured for performing said comparison by comparing a value ($I_{fit}$) for said at least one entity indicative of the aging of the component predicted for a given future time on the basis of said updated prediction model to at least one threshold value defining a limit of a range of acceptable values for operation of said component at said given future time.

25. The system of claim 15, characterized in that said processing unit is configured for performing said comparison by:

determining a future instant of time where, based on said updated prediction model, a predicted value ($I_{fit}$) for said at least one entity indicative of the aging of the component will equal a limit of a range of acceptable values for operation of said component, and comparing said future instant of time thus determined with a time threshold corresponding to an acceptable useful life for the component.

26. The system of claim 15, characterized in that said processing unit is configured for performing said comparison by comparing:

a value ($I_{fit}$) for said at least one entity indicative of the aging of the component as predicted for a given instant of time on the basis of said updated prediction model, and a value for said at least one entity indicative of the aging of the component as derived from measurement at said given instant of time.

27. The system of claim 15, characterized in that the system is configured for operating without interrupting operation of said component.

28. The system of claim 15, characterized in that the system is associated with said component as an on-board system.

* * * * *

UNITED STATES PATENT AND TRADEMARK OFFICE
CERTIFICATE OF CORRECTION

PATENT NO. : 7,146,292 B2
APPLICATION NO. : 10/918688
DATED : December 5, 2006
INVENTOR(S) : Giammarco Rossi et al.

It is certified that error appears in the above-identified patent and that said Letters Patent is hereby corrected as shown below:

Title page, Column 1, (Inventors), Line 1, delete "Stradella" and insert -- Pavia --;

Column 9, Line 11, Claim 8, delete "$A_i(t)^{ni}$" and insert -- $A_i(t)^n i$ --;

Column 10, Line 37, Claim 18, delete "the" and insert -- for the --;

Column 10, Line 51, Claim 19, after "said" delete "said" (Second Occurrence);

Column 11, Line 10, Claim 22, delete "$A_i(t)^{ni}$" and insert -- $A_i(t)^n i$ --.

Signed and Sealed this

Eighth Day of June, 2010

David J. Kappos
*Director of the United States Patent and Trademark Office*